(12) United States Patent
Fuhrmann et al.

(10) Patent No.: US 11,815,530 B2
(45) Date of Patent: Nov. 14, 2023

(54) RF POWER DETECTOR WITH A VARIABLE THRESHOLD

(71) Applicant: Apple Inc., Cupertino, CA (US)

(72) Inventors: Joerg Fuhrmann, Linz (AT); Werner Schelmbauer, Steyr (AT); Herbert Stockinger, Schliersee (DE); Dieter Pimingsdorfer, Linz (AT)

(73) Assignee: Apple Inc., Cupertino, CA (US)

( * ) Notice: Subject to any disclaimer, the term of this patent is extended or adjusted under 35 U.S.C. 154(b) by 686 days.

(21) Appl. No.: 16/976,666

(22) PCT Filed: Mar. 27, 2018

(86) PCT No.: PCT/US2018/024419
§ 371 (c)(1),
(2) Date: Aug. 28, 2020

(87) PCT Pub. No.: WO2019/190466
PCT Pub. Date: Oct. 3, 2019

(65) Prior Publication Data
US 2021/0003613 A1    Jan. 7, 2021

(51) Int. Cl.
*G01R 15/09*    (2006.01)
*H04B 17/10*    (2015.01)
(Continued)

(52) U.S. Cl.
CPC ............. *G01R 15/09* (2013.01); *G01R 21/01* (2013.01); *H03F 3/19* (2013.01); *H03K 5/24* (2013.01);
(Continued)

(58) Field of Classification Search
CPC ........... G01R 15/09; G01R 21/01; H03F 3/19; H03F 2200/294; H03F 2200/451;
(Continued)

(56) References Cited

U.S. PATENT DOCUMENTS 7,773,955 B2    8/2010  Behzad
7,825,716 B1    11/2010 Deguchi
(Continued)

OTHER PUBLICATIONS

International Search Report and Written Opinion for International Application No. PCT/US2018/024419 dated Nov. 6, 2018, 12 pgs.

*Primary Examiner* — Farhana A Hoque
(74) *Attorney, Agent, or Firm* — Kowert, Hood, Munyon, Rankin & Goetzel, P.C.

(57) ABSTRACT

A radio frequency (RF) power detector with a variable threshold for dynamic power detection. The RF power detector includes stacked transistors of an input stage and stacked transistors of an output stage. A DC bias voltage plus an input RF signal are applied to a control electrode on the input stage and the same DC bias voltage plus an additional DC bias voltage are applied to a control electrode on the output stage. Depending on the input power of the RF signal, a Δ current is generated in the output stage, and the output capacitor is either charged or discharged, and the output capacitor voltage is compared to a threshold to generate an output signal. The output signal may be averaged over time by two capacitors, miller capacitor and output capacitor. The output voltage of the RF power detector is an integration over time of the input RF power.

20 Claims, 5 Drawing Sheets

(51) Int. Cl.
*G01R 21/01* (2006.01)
*H03F 3/19* (2006.01)
*H03K 5/24* (2006.01)

(52) U.S. Cl.
CPC ..... *H04B 17/101* (2015.01); *H03F 2200/294* (2013.01); *H03F 2200/451* (2013.01)

(58) Field of Classification Search
CPC ...... H03K 5/24; H04B 17/101; H04B 17/318; H04B 17/102
USPC ........................................................ 324/126
See application file for complete search history.

(56) References Cited

U.S. PATENT DOCUMENTS

| | | |
|---|---|---|
| 2005/0237110 A1 | 10/2005 | Parkhurst et al. |
| 2008/0030279 A1 | 2/2008 | Ojo et al. |
| 2012/0299623 A1* | 11/2012 | Sun ..................... H03G 1/0088 327/355 |

* cited by examiner

US 11,815,530 B2

RF POWER DETECTOR WITH A VARIABLE THRESHOLD

FIELD

Examples relate to a radio frequency (RF) power detector, more particularly an RF power detector with a variable threshold for dynamic power detection.

BACKGROUND

A transmitter includes an RF power detector to monitor the transmit power. Most RF devices need to monitor and control their RF power output to comply with government regulations, minimize RF interference to other devices, minimize its power consumption, and the like. A receiver also includes an RF power detector. A receiver monitors the received signal power and adjusts a gain of an amplifier to maintain an optimal signal power level for subsequent analog-to-digital conversion and demodulation. For these reasons, accurate RF power detection is important in both receivers and transmitters.

BRIEF DESCRIPTION OF THE FIGURES

Some examples of apparatuses and/or methods will be described in the following by way of example only, and with reference to the accompanying figures, in which.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B. An alternative wording for the same combinations is "at least one of A and B". The same applies for combinations of more than 2 Elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Figure 1:
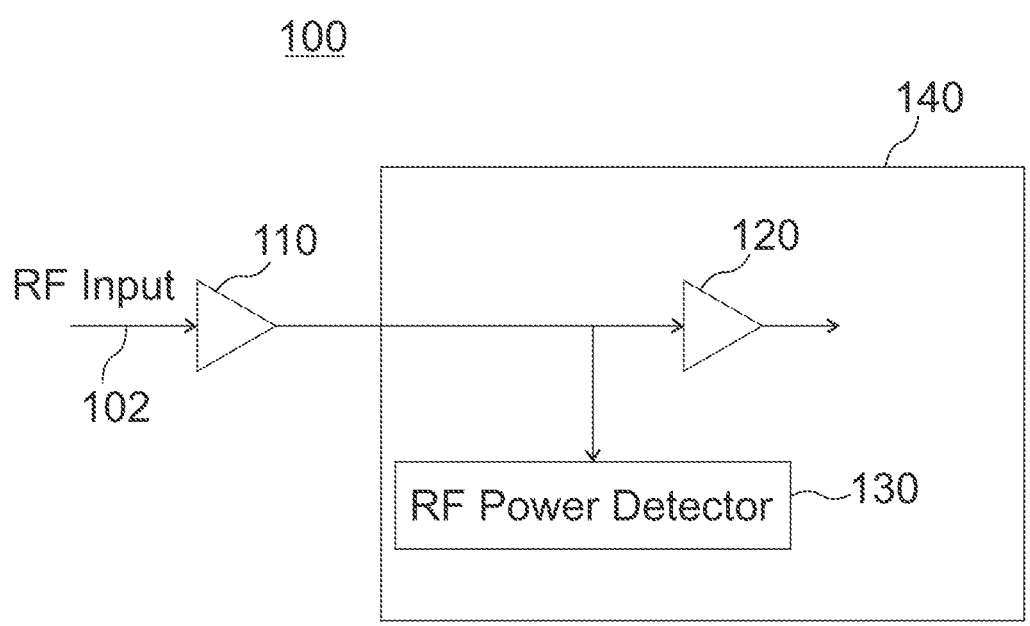
FIG. 1 is a schematic block diagram of an example system.

FIG. 1 is a schematic block diagram of an example system 100. The system 100 (e.g. a receiver) may include an external LNA 110, an internal LNA 120, and an RF power detector 130. The internal LNA 120 and the RF power detector 130 may be in a receiver chip 140 (e.g. an RF IC). An RF input signal 102 is amplified by the external LNA 110 and the internal LNA 120 receives the amplified signal of the external LNA 110. The RF power detector 130 detects the power level of the input RF signal. The RF power detector 130 may be placed next to the internal LNA 120 and receive the same input as the internal LNA 120 in order to protect the internal LNA 120 from being overloaded. Alternatively, the RF power detector 130 may receive an output signal from the internal LNA 120 or the output signal of the external LNA 110 via another amplifier. The RF power detector 130 may be placed anywhere in the receive chain.

It is advantageous to place the RF power detector 130 next to the internal LNA 120, but the RF power detector 130 is at the same time a load to the internal LNA input. To minimize the matching problems at the input the transistor sizes need to be as small as possible (e.g. in the range of parasitic capacitances and electrostatic discharge (ESD) protection). The RF power detector 130 may need to detect very small voltage differences and the system needs to be reliable and robust for all input ports. Due to these boundary conditions the mismatch variation of the threshold voltage ($V_{th}$) may be in the same dimension as the amplitude of the detected signal. Additionally, the RF power detector 130 needs to be negligible in terms of power consumption compared to the receive chain.

The detection of the RF power levels is important to the receiver performance. For performance reasons it is desirable for the receive chain if the external LNA 110 amplifies with a maximum gain. Therefore, the goal is to maximize the time that the external LNA 110 works in this state. If the external LNA 110 receives an unwanted signal (e.g. a blocker signal), the unwanted signal is also amplified and transferred to the internal LNA input. This unwanted signal might have enough power to saturate the internal LNA 120, and in that case, the receive chain could be overloaded and the receiver may not be able to detect a wanted signal at all. Alternatively, a filter-less path may be used for less attenuation of the input signal, and performance and reliability may be traded off between the filter path and the filter-less path.

Conventional system implementations used a power detector to detect an unsafe power level. After detection of the unsafe power level, the external LNA is switched to a back-off mode in which the gain of the external LNA is reduced. In the back-off state, the signal integrity may be assured but the system losses performance since the external LNA is not working with a maximum gain. Additionally, the system does not know if the unwanted signal is still present or not. The conventional systems implemented a periodic switching of the external LNA back to the full gain. In this case, there would be two situations. The system is switched back to the full gain but the unwanted signals is still present or the unwanted signal has already disappeared but the system was not aware of it. In both cases, the receiver may suffer from a loss of a received signal (e.g. an entire sub-frame(s) of a received signal) or a decreased performance.

The conventional system is unaware if a blocker signal is still present and therefore either loses time to go back to full performance or loses the detection of a certain time period (e.g. one or more subframes) because the blocker signal can overload the receive chain. The conventional solutions also did not consider the reliability and robustness for mismatch or discuss the extreme low-level detection.

In examples disclosed herein, if an unwanted signal (e.g. a blocker signal) is detected, the external LNA 110 is switched to a back-off mode, and in a back-off mode, the RF power detector 130 operates with a lower power threshold. This allows the system 100 to detect when the unwanted signal disappears and the external LNA 110 can be switched back to a full gain. Once the external LNA is switched back to a full gain, the RF power detector operates with a higher threshold. This can enhance the functionality, performance and reliability of the entire receive chain and the entire system. Since the signal that is present at the internal LNA is unknown no signal characteristics can be assumed. In accordance with examples, the RF power detector may be able to detect any kinds of modulated signals.

In examples, the RF power detector 130 may include a first transistor of a first conductivity type (N-type or P-type), a second transistor of a second conductivity type opposite (or same as) the first conductivity type, a third transistor of the first conductivity type, a fourth transistor of the second conductivity type, and a comparator. The first transistor may have a first electrode coupled to an output node, a control electrode for receiving an input RF signal and a direct current (DC) bias voltage, and a second electrode. The second transistor may have a first electrode coupled to the first electrode of the first transistor, a control electrode coupled to the first electrode of the second transistor, and a second electrode coupled to a supply voltage. The third transistor may have a first electrode coupled to the output node, a control electrode for receiving the DC bias voltage and an additional DC bias voltage, and a second electrode. The fourth transistor may have a first electrode coupled to the first electrode of the third transistor, a control electrode coupled to the first electrode of the fourth transistor, and a second electrode coupled to the supply voltage. The comparator compares an output signal on the output node to a reference signal.

The RF power detector 130 may be implemented using metal oxide semiconductor field effect transistors (MOSFET), e.g. complementary metal oxide semiconductor (CMOS) transistors, or different types of transistors such as bipolar junction transistors (BJT). The "CMOS transistor" also includes an insulated gate field effect transistor that uses materials other than metal, such as polysilicon, for the gate.

Figure 2:
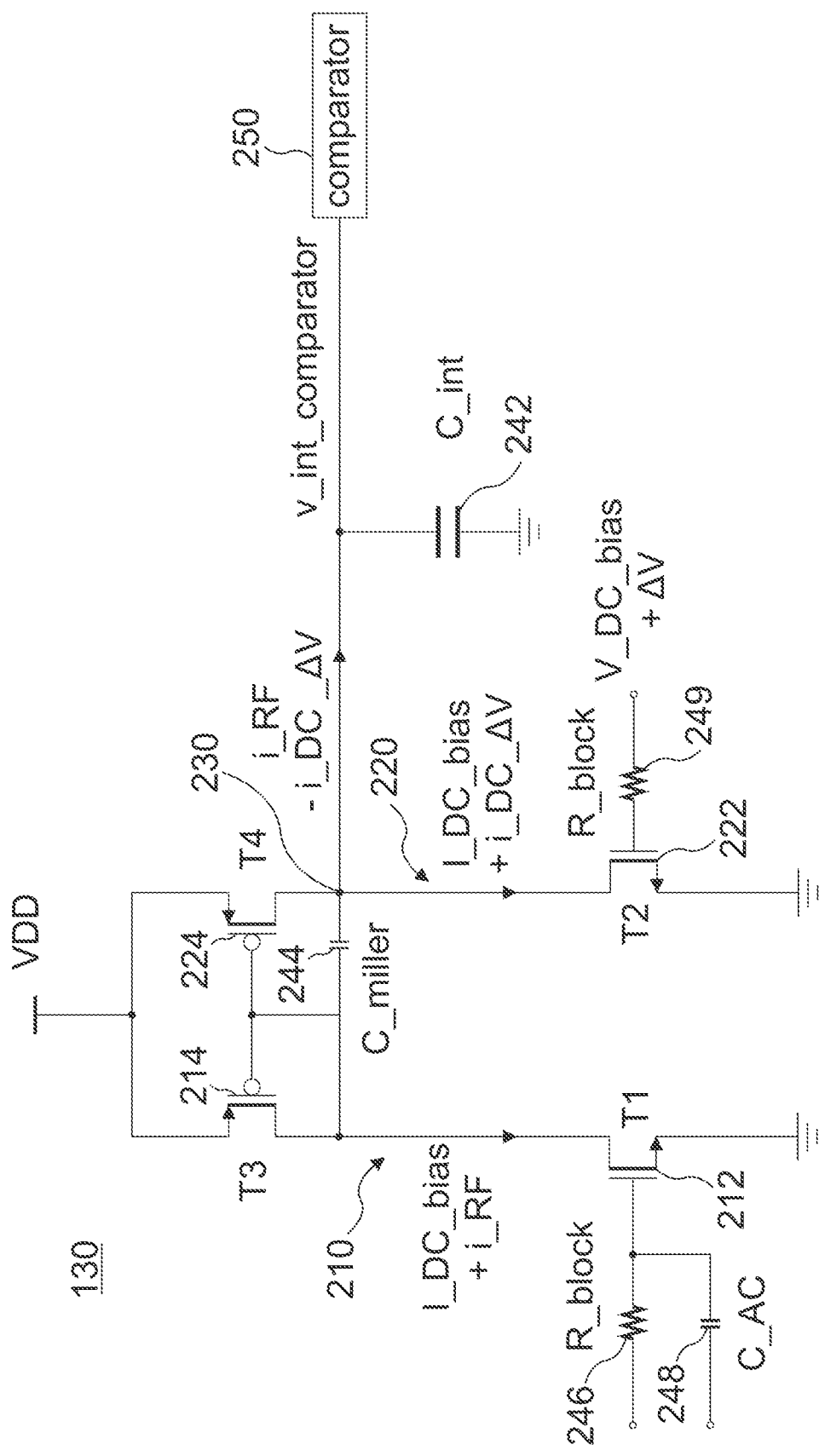
FIG. 2 shows an example RF power detector 130 in accordance with one aspect.

FIG. 2 shows an example RF power detector 130 in accordance with one aspect. The RF power detector 130 may include an N-channel metal-oxide-semiconductor (MOS) transistor 212, a P-channel MOS transistor 214, an N-channel MOS transistor 222, and a P-channel MOS transistor 224. Stacked transistors 212 and 214 form an input stage 210 and stacked transistors 222 and 224 form an output stage 220 (replica stage). The transistors 212 and 214 may have the same characteristics, and the transistors 222 and 224 may have the same characteristics. It should be noted that the structure shown in FIG. 2 is provided as an example, not as a limitation, and the RF power detector may be implemented with different types of transistors/devices or configuration.

A source of transistor 214 and a source of transistor 224 are coupled to $V_{DD}$. A gate (a control electrode) of transistor 214 and a gate (a control electrode) of transistor 224 may be connected and may also be connected to the drain of transistors 214 and 224. A drain of transistors 214 and 224 are coupled to an output node 230. A drain of transistor 214 and a drain of transistor 212 are coupled, and a drain of transistor 224 and a drain of transistor 222 are coupled, respectively. A source of transistor 212 and a source of transistor 222 may be grounded. A DC bias voltage is applied to a gate (a control electrode) of transistor 212 through a resistor 246 and an RF input signal is applied to the gate of transistor 212 via a coupling capacitor 248. The same DC bias voltage applied to the gate of the transistor 212 plus additional DC bias voltage ($\Delta V$) may be applied to a gate (a control electrode) of transistor 222 via a resistor 249. The RF power detector 130 may include an output capacitor 242 coupled in parallel to the output node 230. In some examples, the RF power detector 130 may include a Miller capacitor 244 coupled in series between the input stage 210 and the output stage 220.

As an RF signal enters into the input stage, the power of the input RF signal is converted into a current equivalent to the power. In examples, the current is then compared to a reference current (i.e. a threshold) which corresponds to the desired detectable power level. The desired detectable power level is set by the additional DC bias voltage ($\Delta V$) applied to the gate of the transistor 222. If the level of the input RF signal power is above the threshold, the output capacitor 242 is charged and if the level of the input RF signal power is below the threshold, the output capacitor 242 is discharged. Therefore, the output signal of the RF power detected may be integrated in an analog domain. An RC filter needs to be big enough to achieve a proper integration time.

The input stage 210 may be operated in any bias stage. For example, the transistor 212 may be biased in the sub-threshold area of the transistor 212. In the sub-threshold area, the gate-to-source voltage is below the threshold voltage of a transistor. The drain current of the transistor 212 is an exponential function of the input signal. Due to an exponential transfer function, the upper half of a sinusoidal wave is amplified higher than the lower half of the sinusoidal wave, which causes a DC operating point shift. This shift is also mirrored to the output stage 220.

In the input stage 210, the DC bias voltage plus the RF signal are applied to the gate of the transistor 212, and a drain current (I_DC_bias+i_RF) is generated in the input stage 210, and this current is mirrored to the output stage 220. Due to the Miller capacitor 244 at the output stage an integration of the RF signal occurs, and this leads to a slower variation of the DC current in the output stage 220. In the output stage 220, the same DC bias voltage applied to the input state plus the additional DC bias voltage ($\Delta V$) are applied to the gate of the transistor 222, and a drain current (I_DC_bias+i_DC_$\Delta V$) is generated. The output stage 220 is biased with the additional DC bias voltage ΔV according to an equivalent specified input power. The additional DC bias voltage ΔV may be set dynamically depending on the desirable detectable power level. For example, the ΔV may be set to one of two levels: one for a full gain mode of the external LNA 110 and another for a back-up mode of the external LNA 110. The additional DC bias voltage ΔV may be set for certain input power levels of an unwanted signal, which may be determined by simulation.

Depending on the input power of the RF signal, a Δ current (i_RF−i_DC_ΔV) is generated in the output stage 220. If the generated current of the input RF signal is lower than the generated current due to ΔV, the current that is drawn by the transistor 222 is greater compared to the mirrored current, and the output capacitor 242 is discharged. If the generated current of the input RF signal is greater than the generated current due to ΔV, the current that is drawn by the transistor 222 is smaller compared to the mirrored current, and the output capacitor 242 is charged. Therefore, the analog output signal of the RF power detector 130 is integrated at the output capacitor 242 over time.

In examples, the generated current signal may be averaged over time by two capacitors, the miller capacitor 244 and the output capacitor 242. The output voltage of the RF power detector 130 is an integration over time of the input RF power, and the RF power detector 130 implements time-averaged detection of the input signal.

The output capacitor 242 is coupled to the comparator 250 and the capacitor voltage is compared with an analogue threshold (e.g. 500 mV). The comparator 250 may generate a one-bit output depending on the comparison. The digital signal (the output of the comparator 250) may be counted and averaged over a predetermined period of time, (e.g. additional digital integration may be performed).

In examples, in a back-up mode of the external LNA 110, the RF power detector 130 operates with a lower threshold, which is determined by a lower ΔV. If the blocker signal is still present, the output capacitor 242 will be charged and the output of the comparator 250 will indicate the presence of the blocker signal. If the blocker signal disappears, the output capacitor 242 will be discharged and the output of the comparator 250 will go down so that the disappearance of the blocker signal can be detected immediately. The external LNA 110 may then return to the full gain mode and the RF power detector 130 operates with a higher threshold, which is set by a higher ΔV. With this scheme, a higher performance with minimum latency of the system can be achieved.

Detecting a small power level is a challenge. The small power level generates a very small voltage difference. The voltage difference may be in the range of the threshold voltage variation of the transistors. The transistor mismatch may be decreased by simply increasing the transistor area. However, this may not be allowed because the RF power detector is placed directly next to the internal LNA and therefore is an additional load to the LNA. To cancel this bias error due to the mismatch a certain calibration may be performed. This nulling calibration may cancel the differences between the RF path and the reference path.

Figure 3:
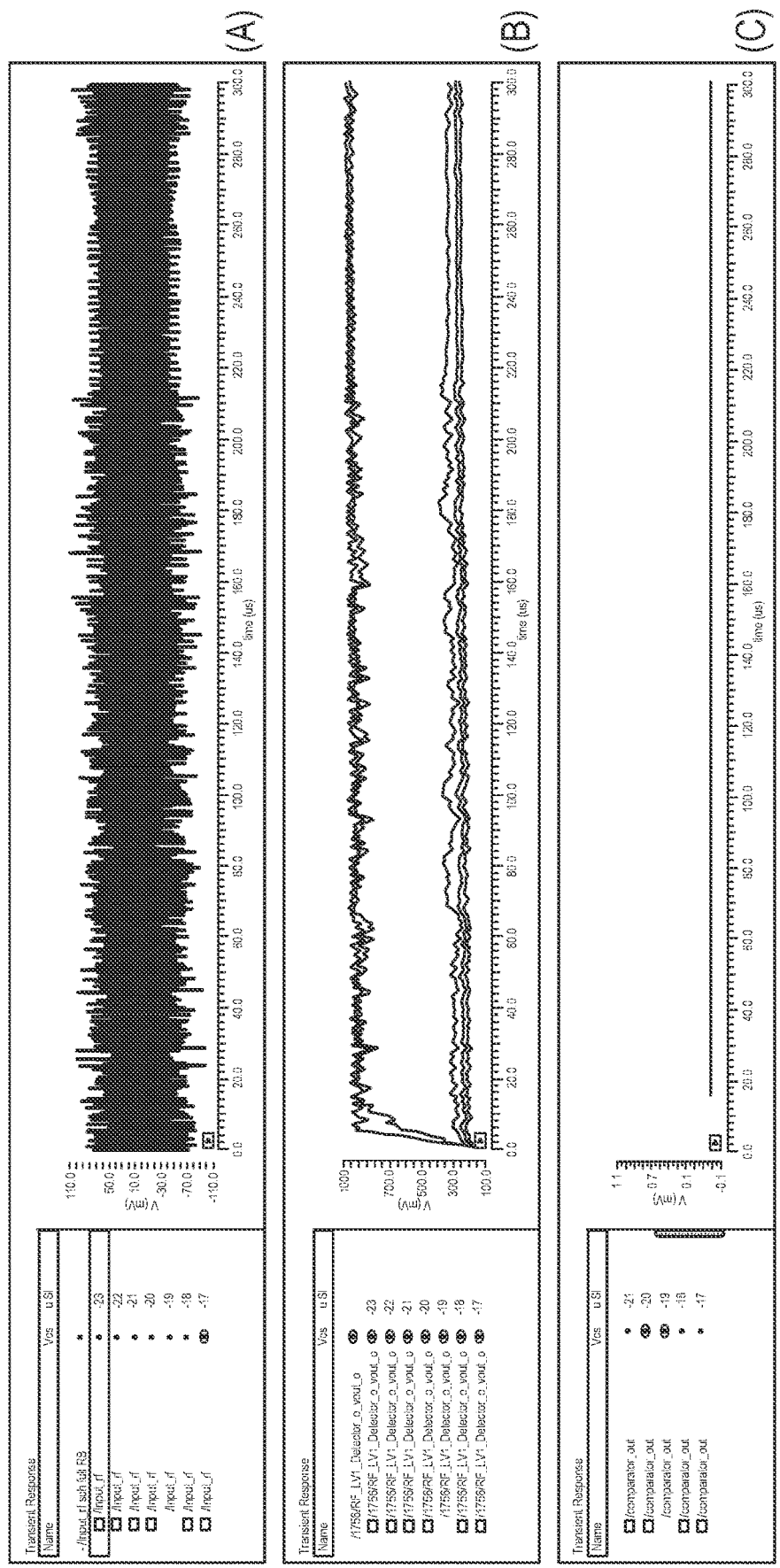
FIGS. 3(a)-3(c) show a detection of a fully allocated Long Term Evolution (LTE) signal.

FIGS. 3(a)-3(c) show a detection of a fully allocated Long Term Evolution (LTE) signal (e.g. resource blocks (RBs) over the entire bandwidth). FIG. 3(a) shows an input RF signal, FIG. 3(b) shows an integrated analog output signal at the output capacitor, and FIG. 3(c) shows a comparator output signal. The fully allocated LTE signal behaves similar as a sinusoidal signal as can be seen in FIG. 3(a). The plots in FIGS. 3(a)-(c) show LTE signals at different power levels but FIG. 3(a) and FIG. 3(c) show only two signals with two different power levels for simplicity. As can be seen in FIG. 3(b), if the input power changes from the level below the threshold to the level above the threshold, the analog output crosses a threshold (e.g. 500 mV) and the comparator detects the signal. In this example, the analogue integration time is shown sufficient to integrate/average the peaks of the LTE signal.

Figure 4:
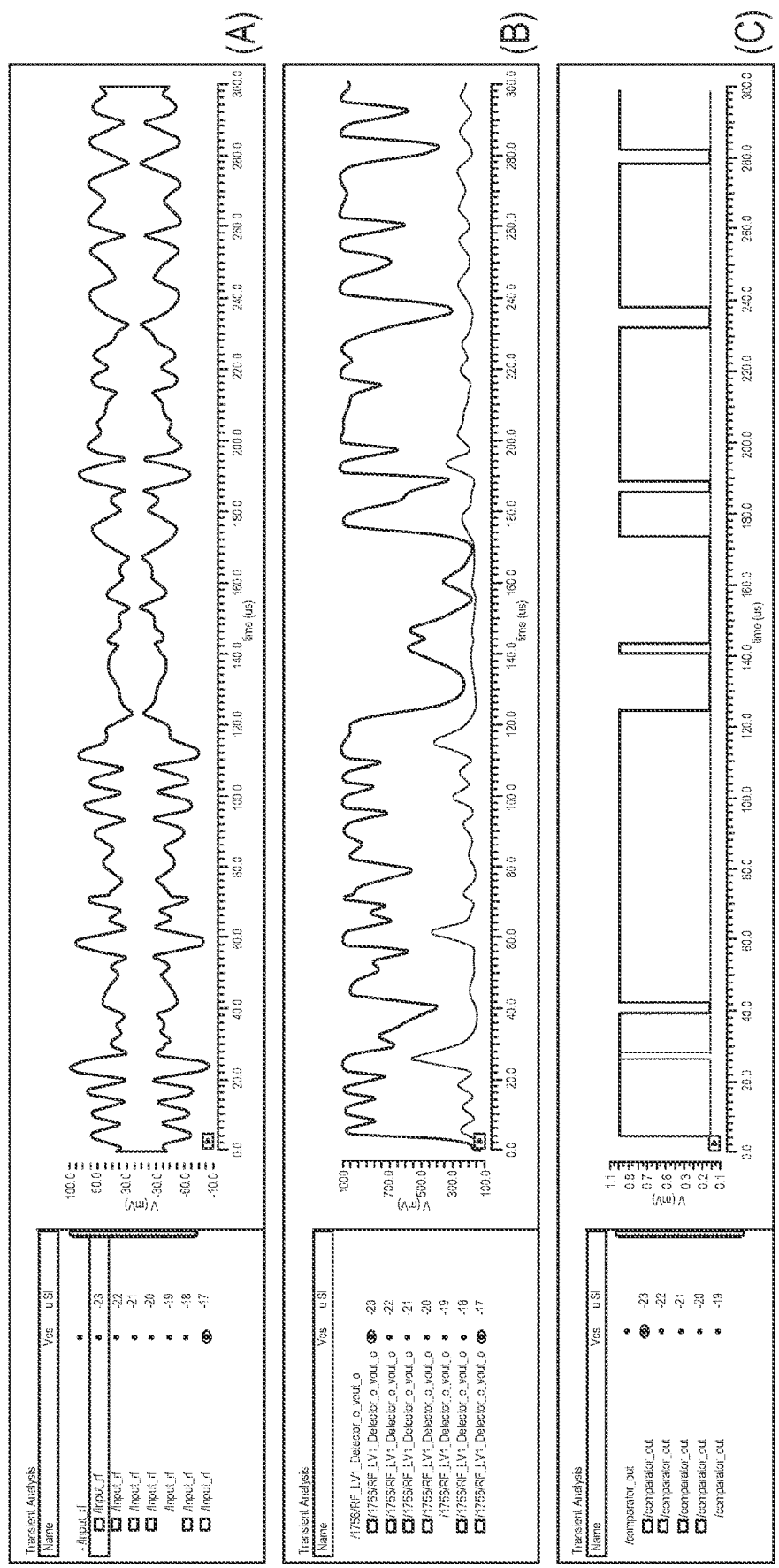
FIGS. 4(a)-4(c) show a detection of a single resource block (RB) LTE signal.

FIGS. 4(a)-4(c) show a detection of a single resource block (RB) LTE signal. FIG. 4(a) shows an input RF signal, FIG. 4(b) shows an integrated analog output signal at the output capacitor, and FIG. 4(c) shows a comparator output signal. In comparison to the fully allocated signal in FIG. 3, the analogue integration may not be sufficient to fully average the signal. Therefore, an additional digital averaging of the comparator output may be performed.

The RF power detector 130 may be implemented as a wide-bandwidth detector that, for example covers the entire Fourth Generation (4G) LTE bandwidth (e.g. between 0.5 GHz to 6.0 GHz). The RF power detector 130 may detect spurs in a certain power range (e.g. −20 dBm to 0 dBm). This gives the system the possibility to detect and average the detected signal and additionally analyze it. The averaging time constant may be implemented in two stages. Firstly, the Miller capacitor 244 in the current mirror provides a first integration of the signal. Secondly, the delta current in the output stage is integrated at the output capacitor 242. This two-stage integration may be extended and even done in a more dynamic way to change the time constant and therefore change the integration time of the signal.

In accordance with examples, the system knows the entire time whether the unwanted signal (e.g. a blocker signal) is present or not, and it can adapt dynamically to get the best trade-off between the signal integrity and the receive performance.

In some examples, in order to detect even smaller power levels an additional amplifier may be added in front of the RF power detector 130. Alternatively, the RF power detector 130 may be placed at a different position inside the system (e.g. at the output of the internal LNA 120 instead of the input of the internal LNA 120). Alternatively, the RF power detector 130 may be placed anywhere in the receive chain and may take an input from anywhere, e.g. from the coupler or the antenna, etc.

The output of the RF power detector 130 may be a single bit. The output of the RF power detector 130 may be processed through digital post-processing and data evaluation.

The RF power detector 130 may be implemented at different positions inside a system to detect certain power levels. For example, an RF power detector 130 may be used to detect the difference in power between a path with a filter(s) and a path without a filter and switch between the filter path and the filter-less path.

Another example is a computer program having a program code for performing at least one of the methods described herein, when the computer program is executed on a computer, a processor, or a programmable hardware component. Another example is a machine-readable storage including machine readable instructions, when executed, to implement a method or realize an apparatus as described herein. A further example is a machine-readable medium including code, when executed, to cause a machine to perform any of the methods described herein.

Figure 5:
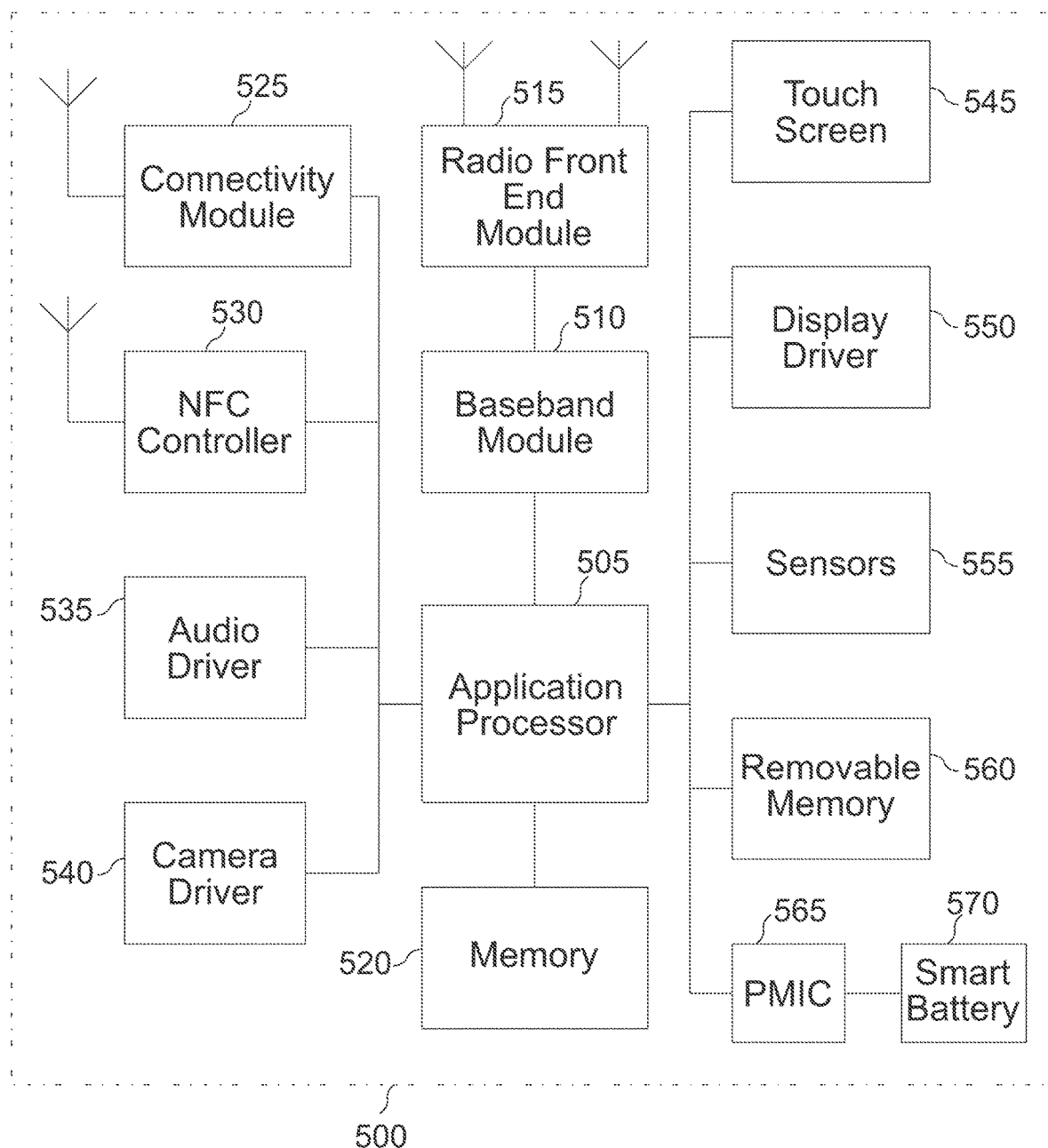
FIG. 5 illustrates a user device in accordance with an aspect.

FIG. 5 illustrates a user device 500 in accordance with an aspect. The user device 500 may be a mobile device in some aspects and includes an application processor 505, baseband processor 510 (also referred to as a baseband module), radio front end module (RFEM) 515, memory 520, connectivity module 525, near field communication (NFC) controller 530, audio driver 535, camera driver 540, touch screen 545, display driver 550, sensors 555, removable memory 560, power management integrated circuit (PMIC) 565 and smart battery 570.

In some aspects, application processor 505 may include, for example, one or more CPU cores and one or more of cache memory, low drop-out voltage regulators (LDOs), interrupt controllers, serial interfaces such as serial peripheral interface (SPI), inter-integrated circuit (I2C) or universal programmable serial interface module, real time clock (RTC), timer-counters including interval and watchdog timers, general purpose input-output (IO), memory card controllers such as secure digital/multi-media card (SD/MMC) or similar, universal serial bus (USB) interfaces, mobile industry processor interface (MIPI) interfaces and Joint Test Access Group (JTAG) test access ports.

In some aspects, baseband module 510 may be implemented, for example, as a solder-down substrate including one or more integrated circuits, a single packaged integrated circuit soldered to a main circuit board, and/or a multi-chip module containing two or more integrated circuits.

In some aspects, the radio front end module (RFEM) 515 may include among other modules a receiver such as the receiver 100 described above. For example, the receiver in the RFEM 515 may include LNAs such as LNA 120 and a RF power detector such as RF power detector 130 described above.

The examples as described herein may be summarized as follows:

Example 1 is an RF power detector. The RF power detector comprises a first transistor of a first conductivity type having a first electrode coupled to an output node, a control electrode for receiving an input RF signal and a DC bias voltage, and a second electrode, a second transistor of a second conductivity type opposite the first conductivity type having a first electrode coupled to the first electrode of the first transistor, a control electrode coupled to the first electrode of the second transistor, and a second electrode coupled to a supply voltage, a third transistor of the first conductivity type having a first electrode coupled to the output node, a control electrode for receiving the DC bias voltage and an additional DC bias voltage, and a second electrode, a fourth transistor of the second conductivity type having a first electrode coupled to the first electrode of the third transistor, a control electrode coupled to the first electrode of the fourth transistor, and a second electrode coupled to the supply voltage, and a comparator for comparing an output signal on the output node to a reference signal.

Example 2 is the RF power detector of example 1, further comprising an output capacitor coupled to the output node.

Example 3 is the RF power detector as in any one of examples 1-2, further comprising a capacitor coupled between the first electrode of the first transistor and the first electrode of the third transistor.

Example 4 is the RF power detector as in any one of examples 1-3, wherein the DC bias voltage is in a sub-threshold region of the first transistor.

Example 5 is the RF power detector as in any one of examples 1-4, wherein the additional DC bias voltage is determined based on a desirable detectable input power.

Example 6 is the RF power detector as in any one of examples 1-5, wherein an output of the comparator is averaged over a predetermined period of time.

Example 7 is the RF power detector as in any one of examples 1-6, wherein the input RF signal is taken from an output of an external low noise amplifier in a receive chain.

Example 8 is the RF power detector as in any one of examples 1-7, wherein the input RF signal is taken from an output of an internal low noise amplifier in a receive chain.

Example 9 is the RF power detector as in any one of examples 1-8, wherein the input RF signal is taken from a path including a filter or a path not including a filter.

Example 10 is a system comprising an external low noise amplifier for amplifying an input RF signal, an internal low noise amplifier for amplifying the input RF signal amplified by the external low noise amplifier, and an RF power detector for detecting a power of the input RF signal. The RF power detector comprises a first transistor of a first conductivity type having a first electrode coupled to an output node, a control electrode for receiving an input RF signal and a DC bias voltage, and a second electrode, a second transistor of a second conductivity type opposite the first conductivity type having a first electrode coupled to the first electrode of the first transistor, a control electrode coupled to the first electrode of the second transistor, and a second electrode coupled to a supply voltage, a third transistor of the first conductivity type having a first electrode coupled to the output node, a control electrode for receiving the DC bias voltage and an additional DC bias voltage, and a second electrode, a fourth transistor of the second conductivity type having a first electrode coupled to the first electrode of the third transistor, a control electrode coupled to the first electrode of the fourth transistor, and a second electrode coupled to the supply voltage, and a comparator for comparing an output signal on the output node to a reference signal.

Example 11 is the system of example 10, wherein the RF power detector further comprises an output capacitor coupled to the output node.

Example 12 is the system as in any one of examples 10-11, wherein the RF power detector further comprises a capacitor coupled between the first electrode of the first transistor and the first electrode of the third transistor.

Example 13 is the system as in any one of examples 10-12, wherein the DC bias voltage is in a sub-threshold region of the first transistor.

Example 14 is the system as in any one of examples 10-13, wherein the additional DC bias voltage is determined based on a desirable detectable input power.

Example 15 is the system as in any one of examples 10-14, wherein an output of the comparator is averaged over a predetermined period of time.

Example 16 is the system as in any one of examples 10-15, wherein the RF power detector receives the input RF signal from an output of the external low noise amplifier.

Example 17 is the system as in any one of examples 10-16, wherein the RF power detector receives the input RF signal from an output of the internal low noise amplifier.

Example 18 is the system as in any one of examples 10-17, wherein the RF power detector is configured to compare a signal power on a path including a filter and a path not including a filter.

Example 19 is a non-transitory machine-readable medium including machine-readable instructions, when executed, to realize an apparatus as in any one of examples 1-18.

The aspects and features mentioned and described together with one or more of the previously detailed examples and figures, may as well be combined with one or more of the other examples in order to replace a like feature of the other example or in order to additionally introduce the feature to the other example.

Examples may further be or relate to a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. Furthermore, all examples recited herein are principally intended expressly to be only for pedagogical purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A functional block denoted as "means for . . . " performing a certain function may refer to a circuit that is configured to perform a certain function. Hence, a "means for s.th." may be implemented as a "means configured to or suited for s.th.", such as a device or a circuit configured to or suited for the respective task.

Functions of various elements shown in the figures, including any functional blocks labeled as "means", "means for providing a sensor signal", "means for generating a transmit signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software, but may include digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:
1. A radio frequency (RF) power detector, comprising:
   a first transistor of a first conductivity type having a first electrode coupled to an output node, a control electrode for receiving an input RF signal and a direct current (DC) bias voltage, and a second electrode;
   a second transistor of a second conductivity type opposite the first conductivity type having a first electrode coupled to the first electrode of the first transistor, a control electrode coupled to the first electrode of the second transistor, and a second electrode coupled to a supply voltage;
   a third transistor of the first conductivity type having a first electrode coupled to the output node, a control electrode for receiving the DC bias voltage and an additional DC bias voltage, and a second electrode;
   a fourth transistor of the second conductivity type having a first electrode coupled to the first electrode of the third transistor, a control electrode coupled to the first electrode of the fourth transistor, and a second electrode coupled to the supply voltage; and
   a comparator for comparing an output signal on the output node to a reference signal.

2. The RF power detector of claim 1, further comprising: an output capacitor coupled to the output node.

3. The RF power detector of claim 1, further comprising: a capacitor coupled between the first electrode of the first transistor and the first electrode of the third transistor.

4. The RF power detector of claim 1, wherein the DC bias voltage is in a sub-threshold region of the first transistor.

5. The RF power detector of claim 1, wherein the additional DC bias voltage is determined based on a desirable detectable input power.

6. The RF power detector of claim 1, wherein an output of the comparator is averaged over a predetermined period of time.

7. The RF power detector of claim 1, wherein the input RF signal is taken from an output of an external low noise amplifier in a receive chain.

8. The RF power detector of claim 1, wherein the input RF signal is taken from an output of an internal low noise amplifier in a receive chain.

9. The RF power detector of claim 1, wherein the input RF signal is taken from a path including a filter or a path not including a filter.

10. A system comprising:
an external low noise amplifier for amplifying an input radio frequency (RF) signal;
an internal low noise amplifier for amplifying the input RF signal amplified by the external low noise amplifier; and
an RF power detector for detecting a power of the input RF signal, comprising:
a first transistor of a first conductivity type having a first electrode coupled to an output node, a control electrode for receiving an input RF signal and a direct current (DC) bias voltage, and a second electrode;
a second transistor of a second conductivity type opposite the first conductivity type having a first electrode coupled to the first electrode of the first transistor, a control electrode coupled to the first electrode of the second transistor, and a second electrode coupled to a supply voltage;
a third transistor of the first conductivity type having a first electrode coupled to the output node, a control electrode for receiving the DC bias voltage and an additional DC bias voltage, and a second electrode;
a fourth transistor of the second conductivity type having a first electrode coupled to the first electrode of the third transistor, a control electrode coupled to the first electrode of the fourth transistor, and a second electrode coupled to the supply voltage; and
a comparator for comparing an output signal on the output node to a reference signal.

11. The system of claim 10, wherein the RF power detector further comprises:
an output capacitor coupled to the output node.

12. The system of claim 10, wherein the RF power detector further comprises:
a capacitor coupled between the first electrode of the first transistor and the first electrode of the third transistor.

13. The system of claim 10, wherein the DC bias voltage is in a sub-threshold region of the first transistor.

14. The system of claim 10, wherein the additional DC bias voltage is determined based on a desirable detectable input power.

15. The system of claim 10, wherein an output of the comparator is averaged over a predetermined period of time.

16. The system of claim 10, wherein the RF power detector receives the input RF signal from an output of the external low noise amplifier.

17. The system of claim 10, wherein the RF power detector receives the input RF signal from an output of the internal low noise amplifier.

18. The system of claim 10, wherein the RF power detector is configured to compare a signal power on a path including a filter and a path not including a filter.

19. A user device comprising:
a baseband processor; and
a radio front end module coupled to the baseband processor and comprising:
a first transistor of a first conductivity type having a first electrode coupled to an output node, a control electrode for receiving an input RF signal and a direct current (DC) bias voltage, and a second electrode;
a second transistor of a second conductivity type opposite the first conductivity type having a first electrode coupled to the first electrode of the first transistor, a control electrode coupled to the first electrode of the second transistor, and a second electrode coupled to a supply voltage;
a third transistor of the first conductivity type having a first electrode coupled to the output node, a control electrode for receiving the DC bias voltage and an additional DC bias voltage, and a second electrode;
a fourth transistor of the second conductivity type having a first electrode coupled to the first electrode of the third transistor, a control electrode coupled to the first electrode of the fourth transistor, and a second electrode coupled to the supply voltage; and
a comparator for comparing an output signal on the output node to a reference signal.

20. The user device of claim 19, wherein the radio front end module further comprises one or more of:
an output capacitor coupled to the output node; or
a capacitor coupled between the first electrode of the first transistor and the first electrode of the third transistor.

* * * * *